United States Patent
Bavois

(10) Patent No.: US 10,734,929 B2
(45) Date of Patent: Aug. 4, 2020

(54) DEVICE AND METHOD FOR SYMMETRIC LOAD SWITCHING IN AN H BRIDGE

(71) Applicants: Continental Automotive France, Toulouse (FR); Continental Automotive GmbH, Hannover (DE)

(72) Inventor: Thierry Bavois, Toulouse (FR)

(73) Assignees: Continental Automotive France (FR); Continental Automotive GmbH (DE)

( * ) Notice: Subject to any disclaimer, the term of this patent is extended or adjusted under 35 U.S.C. 154(b) by 85 days.

(21) Appl. No.: 16/072,960

(22) PCT Filed: Feb. 7, 2017

(86) PCT No.: PCT/FR2017/050275
§ 371 (c)(1),
(2) Date: Jul. 26, 2018

(87) PCT Pub. No.: WO2017/137692
PCT Pub. Date: Aug. 17, 2017

(65) Prior Publication Data
US 2019/0044463 A1    Feb. 7, 2019

(30) Foreign Application Priority Data
Feb. 8, 2016  (FR) ...................... 16 50968

(51) Int. Cl.
*H02P 7/03*  (2016.01)
*H02P 6/28*  (2016.01)
(Continued)

(52) U.S. Cl.
CPC .................. *H02P 7/04* (2016.02); *G05F 1/56* (2013.01); *H02P 6/28* (2016.02); *H02P 7/29* (2013.01);
(Continued)

(58) Field of Classification Search
CPC ...... H02P 7/04; H02P 7/29; H02P 8/12; H02P 23/24; H02P 6/28; H02P 7/05;
(Continued)

(56) References Cited

U.S. PATENT DOCUMENTS 5,287,046 A * 2/1994 Carpenter .............. G11B 21/02
                                                        318/293
5,317,245 A   5/1994 Moritz et al.
(Continued)

FOREIGN PATENT DOCUMENTS

DE            19927904 A1    1/2001

OTHER PUBLICATIONS

International Search Report and Written Opinion for International Application No. PCT/FR2017/050275, dated May 8, 2017—10 pages.
(Continued)

*Primary Examiner* — Thai T Dinh
(74) *Attorney, Agent, or Firm* — RatnerPrestia

(57) ABSTRACT

An H-bridge device and an associated method for controlling an H-bridge, driving a load such as a DC current electric motor, configured to prevent any reversal of polarity in the load in an unloading phase of said load, without having to limit use of the pulse generator supplying said H-bridge in terms of duty cycle. The H-bridge device includes independent comparators and independent slope control at each of the switches of the H-bridge. Furthermore, according to one aspect, the device includes 'push-pull' drivers imposing the potential VBAT/2 at the connection points OUT0, OUT1, on either side of the load, in order to limit electromagnetic interference.

12 Claims, 1 Drawing Sheet

(51) Int. Cl.
*G05F 1/56* (2006.01)
*H02P 7/29* (2016.01)
*H03K 5/24* (2006.01)
*G01R 19/165* (2006.01)

(52) U.S. Cl.
CPC ......... *H03K 5/24* (2013.01); *G01R 19/16552* (2013.01)

(58) Field of Classification Search
CPC ....... H03K 17/0822; H03K 2217/0045; H03K 5/24; G05F 1/56
See application file for complete search history.

(56) References Cited

U.S. PATENT DOCUMENTS

| | | | | |
|---|---|---|---|---|
| 5,428,522 | A * | 6/1995 | Millner | H02M 7/53871 363/63 |
| 5,495,155 | A * | 2/1996 | Juzswik | G01R 31/42 318/256 |
| 6,445,530 | B1 * | 9/2002 | Baker | G11B 5/5526 360/67 |
| 6,995,531 | B2 * | 2/2006 | Ichimaru | H02M 7/5388 318/400.29 |
| 7,589,487 | B2 * | 9/2009 | Moller | H02P 7/0094 318/603 |
| 9,568,560 | B2 * | 2/2017 | Pasqualetto | H03K 17/0822 |
| 10,461,609 | B2 * | 10/2019 | Bader | H03K 17/687 |
| 2007/0064460 | A1 | 3/2007 | Siman-Tov | |
| 2016/0077542 | A1 * | 3/2016 | Everson | G05F 3/267 318/504 |

OTHER PUBLICATIONS

Texas Instruments, "AN-694 A DMOS 3A, 55V, H-Bridge: The LMD18200", Apr. 1, 2013, Retrieved from the Internet: http://www.ti.com/lit/an/snoa170c/snoa170c.pdf, retrieved on Jun. 3, 2015—18 pages.

* cited by examiner

DEVICE AND METHOD FOR SYMMETRIC LOAD SWITCHING IN AN H BRIDGE

CROSS REFERENCE TO RELATED APPLICATIONS

This application is the U.S. National Phase Application of PCT International Application No. PCT/EP2017/050275, filed Feb. 7, 2017, which claims priority to French Patent Application No. 1650968, filed Feb. 8, 2016, the contents of such applications being incorporated by reference herein.

FIELD OF THE INVENTION

The invention relates to the field of integrated electronic circuits, in particular H-bridge devices as they are commonly known, that are intended to control the polarity at the terminals of a load by way of a plurality of switches that are commanded for example using a pulse generator.

More precisely, the present invention endeavors to propose a device and an associated method aimed at optimizing symmetrical management of the switching of a load driven by way of such an H-bridge.

BACKGROUND OF THE INVENTION

The H-bridge is an electronic structure that is generally used to control the polarity at the terminals of a load. It is formed of four switching elements that are generally arranged schematically in the shape of an H. The switches may be relays, transistors, or other switching elements, depending on the targeted application. H-bridges are used in numerous power electronics applications, in particular in controlling motors, converters and choppers, as well as inverters.

As known to those skilled in the art, the H-bridge, as shown schematically in FIG. 1, is used by activating the switches in various combinations in order to achieve the desired connection.

The H-bridge makes it possible to perform two main functions that consist, respectively, in reversing the direction of rotation of the motor M, by reversing the voltage across the terminals of said motor, and in varying the speed of the motor M, by modulating the voltage across the terminals of said motor.

Conventionally, the H-bridge drives a load, typically a DC current electric motor M. The H-bridge is therefore intended mainly to allow said load to be supplied with current in both directions. To this end, the H-bridge consists of an electronic circuit in an H, comprising switches, generally transistors, that are able to be commanded so as to be closed or open, respectively ON or OFF, depending on the direction of the current that is to supply the load. Conventionally, with reference to FIG. 1, those branch parts of the H-bridge that are situated on the ground side, that is to say comprising the second and fourth switches LS0 and LS1, are called 'low side'; on the other hand, those branch parts of the H-bridge that are situated on the power supply side and comprising the first and third switches HS0 and HS1 are called 'high side', in accordance with the technical terminology known to those skilled in the art.

As outlined above, FIG. 1 shows a conventional H-bridge. The transistors HS0, HS1, LS0, LS1 are commanded by a microcontroller (not shown). To supply the motor M with current in a forward direction, the transistors HS0 and LS1 are closed, and the transistors HS1 and LS0 are opened. In this case, the H-bridge supplies power to the motor M in the forward direction, as it is commonly termed, going from the first switch HS0 to the fourth switch LS1 in FIG. 1. By contrast, to supply the motor M with current in the reverse direction, the transistors HS1 and LS0 are closed, and the transistors HS0 and LS1 are opened. In this case, the H-bridge supplies the motor M with a current going in the reverse direction, as it is commonly termed, going from the second switch HS1 to the third switch LS0 in FIG. 1.

The switching operations of the switches are controlled by way of a pulse generator (not shown) having, alternately, a high state and a low state of variable duration.

The first and third switches HS0 and LS0 are moreover connected to the load, formed by the motor M, by a first connection point OUT0, whereas the second and fourth switches HS1 and LS1 are connected to the motor M by a second connection point OUT1.

In addition, the H-bridge may allow magnetic braking to be performed by dissipating the power that is generated. In the general case, the two upper switches HS0, HS1 or lower switches LS0, LS1 are then actuated simultaneously, thereby short-circuiting the terminals of the motor M, and therefore making it unload.

However, there are various strategies for controlling an H-bridge, in particular for the purpose of allowing switching operations that are quicker and emit less electromagnetic interference. Thus, one known technique, referred to using the expression 'lock anti-phase mode', makes it possible to control the four switches of an H-bridge using a pulse generator, without having to short-circuit the load in order to unload it, according to the principle briefly described below.

With reference to FIG. 1, the battery BAT supplies the voltage VBAT to the H-bridge. Said H-bridge is controlled using a pulse generator situated at a high level, and the first and fourth switches HS0 and LS1 are closed, so as to load the motor M in the forward direction.

To reduce the current in the load, that is to say to unload the motor M, it is possible to open the first and fourth switches HS0, LS1, a possible battery BAT loading phenomenon then occurring, and then to close the second and third switches HS1, LS0, so as to allow current to flow in the reverse direction, in order to unload the motor M, but taking care not to go as far as reversing the polarity at the load. Such a reversal of polarity in the motor M, if it were to occur, would specifically be liable to damage said motor M, as it would cause an undesired reversal of its direction of rotation.

This requirement to avoid causing a reversal of polarity in the motor M leads to a severe constraint in the controlling of the H-bridge. In practice, according to the prior art, the duty cycle of the pulse generator should be set at 50%, so as to guarantee that unloading the motor M will not result in reversal of the polarity in said motor.

This constraint constitutes a highly inconvenient drawback, and one that is even prohibitive when it is necessary to control an H-bridge driving a DC current electric motor in a motor vehicle.

SUMMARY OF THE INVENTION

There is therefore a need for an improved H-bridge device and a method for controlling such an H-bridge that allows use of a mode for controlling said H-bridge in accordance with the 'lock anti-phase mode' principle described above, providing additional means for detecting any risk of reversal of polarity and managing such a risk, without constricting the duty cycle of the pulse generator that is used.

By virtue of an aspect of the present invention, it is thus possible to control an H-bridge driving a load in a quick and safe manner. According to one embodiment, the H-bridge device according to an aspect of the invention furthermore emits little electromagnetic interference by virtue of the controlling of the potentials of the points of connection to the load.

To this end, one subject of the an aspect of present invention is an H-bridge device with symmetrical load switching, said H-bridge comprising a first, a second, a third and a fourth switch that are distributed over two branches of the H-bridge supplying power to a load, said four switches distributed over two branches being arranged, with respect to said load, such that the first and third switches are linked to the load via a first connection point, on one side of the load, and the second and fourth switches are linked to the load via a second connection point, on the other side of the load, such that the closure of one pair of switches, comprising the first and the fourth switches, allows a current to flow through the load in a forward direction, and that the closure of the other pair of switches, comprising the second and the third switches, allows a current to flow through the load in the reverse direction, an upper part of the H-bridge, called 'high side', comprising the first and second switches, being intended to be linked to a power supply, and a lower part of the H-bridge, called 'low side', comprising the third and fourth switches, being intended to be linked to ground, said H-bridge device being intended to be controlled by way of a pulse generator having a high state or a low state. According to an aspect of the invention, the H-bridge device comprises independent comparators for comparing the magnitude of the current flowing through each of the switches with a reference magnitude, said switches and said comparators being configured so that, when the pulse generator is in a high state, the first and fourth switches being closed, so as to load the load in the forward direction:
  i. when the pulse generator switches to a low state, the first and fourth switches are opened,
  ii. when the four switches are open, after a dead time, the second and third switches are closed, so as to unload the load, the independent comparators comparing the magnitude of the current flowing through each of the switches with the reference magnitude,
  iii. if the magnitude of the current flowing through one of the switches falls below the reference magnitude, the second and third switches are opened,
  iv. when the pulse generator switches to a new high state, if the second and third switches were opened in the previous step, step i. is implemented again; otherwise, the second and third switches are opened and then, after a dead time, step i. is implemented again.

Advantageously, said switches and said comparators are configured so that, when the pulse generator is in a high state, the second and third switches being closed, so as to load the load in the reverse direction:
  i. when the pulse generator switches to a low state, the second and third switches are opened,
  ii. when the four switches are open, after a dead time, the first and fourth switches are closed, so as to unload the load, the independent comparators comparing the magnitude of the current flowing through each of the switches with the reference magnitude,
  iii. if the magnitude of the current flowing through one of the switches falls below the reference magnitude, the first and fourth switches are opened,
  iv. when the pulse generator switches to a new high state, if the first and fourth switches were opened in the previous step, step i. is implemented again; otherwise, the first and fourth switches are opened and then, after a dead time, step i. is implemented again.

According to one preferred embodiment, the H-bridge device with symmetrical load switching, according to an aspect of the invention, also comprises independent means for controlling the current and voltage slopes, controlling the evolution, as a function of time, of the magnitude of the current flowing through each of said switches and the evolution, as a function of time, of the voltage across the terminals of each of said switches, said independent means for controlling the current and voltage slopes being configured and driven so as to ensure that the negative evolution of the current and of the voltage on the side of the lower part of the H-bridge and the positive evolution of the current and of the voltage on the side of the upper part of the H-bridge, on each side of the load, occur at the same rate, such that the sum of the potentials at the connection points, on either side of the load, is constant.

According to one embodiment, the H-bridge device with symmetrical load switching comprises means for setting a reference potential equal to half the high state at the connection points, on either side of the load, when each of said switches is open.

This has the advantage of guaranteeing that the sum of the potentials at the connection points, on either side of the load, is constant and equal to the supply voltage, whether the switches are closed, in switching phase or open.

According to one embodiment, the means for setting the reference potential at the connection points, on either side of the load, are formed by a resistive bridge and a 'push-pull' driver, on either side of the load, each of said 'push-pull' drivers being connected to one connection point, respectively.

According to one embodiment, the reference magnitude is equal to 100 µA. This makes it possible to ensure that the current flowing through each switch is greater than this reference current, so as to prevent any reversal of polarity at the terminals of the load.

An aspect of the invention also targets a method for the symmetrical switching of an H-bridge with symmetrical load switching according to one of the preceding features, comprising the following steps, when the pulse generator is in a high state, the first and fourth switches being closed, so as to load the load in the forward direction, and the means for controlling the current and voltage slopes of said first and fourth switches ensuring that the sum of the potentials at the points of connection to the load, on either side of the load, is equal to a constant:
  i. when the pulse generator switches to a low state, the first and fourth switches are opened, the means for controlling the current and voltage slopes of said first and fourth switches ensuring that the sum of the potentials at the points of connection to the load, on either side of the load, is equal to a constant,
  ii. when the four switches are open, after a dead time, the second and third switches are closed, so as to unload the load, the independent comparators comparing the magnitude of the current flowing through each of the switches with the reference magnitude,
  iii. if the magnitude of the current flowing through each of the switches falls below the reference magnitude, the second and third switches are opened, the means for controlling the current and voltage slopes of said second and third switches ensuring that the sum of the potentials at the points of connection to the load, on either side of the load, is equal to a constant, iv. when the pulse generator switches to a new high state, if the second and third switches were opened in the previous step, step i. is implemented again; otherwise, the second and third switches are opened, the means for controlling the current and voltage slopes of said second and third switches ensuring that the sum of the potentials of connection to the load, on either side of the load, is equal to a constant, and then, after a dead time, step i. is implemented again.

According to such a method for the symmetrical switching of an H-bridge, when the pulse generator is in a high state, the second and third switches being closed, so as to load the load in the reverse direction, and the means for controlling the current and voltage slopes of said second and third switches ensuring that the sum of the potentials at the points of connection to the load, on either side of the load, is equal to a constant:

i. when the pulse generator switches to a low state, the second and third switches are opened, the means for controlling the current and voltage slopes of said second and third switches ensuring that the sum of the potentials at the points of connection to the load, on either side of the load, is equal to a constant, ii. when the four switches are open, after a dead time, the first and fourth switches are closed, so as to unload the load, the independent comparators comparing the magnitude of the current flowing through each of the switches with the reference magnitude, iii. if the magnitude of the current flowing through each of the switches falls below the reference magnitude, the first and fourth switches are opened, the means for controlling the current and voltage slopes of said first and fourth switches ensuring that the sum of the potentials at the points of connection to the load, on either side of the load, is equal to a constant, iv. when the pulse generator switches to a new high state, if the first and fourth switches were opened in the previous step, step i. is implemented again; otherwise, the first and fourth switches are opened, the means for controlling the current and voltage slopes of said first and fourth switches ensuring that the sum of the potentials at the points of connection to the load, on either side of the load, is equal to a constant, and then, after a dead time, step i. is implemented again.

BRIEF DESCRIPTION OF THE DRAWING

Aspects of the invention will be better understood upon reading the following description, given solely by way of example, and with reference to the appended drawings, in which.

It should be noted that the figures disclose aspects of the invention in a detailed manner so as to enable the implementation thereof, said figures also being able to serve to better define aspects of the invention, of course.

DETAILED DESCRIPTION OF THE PREFERRED EMBODIMENTS

An aspect of the invention is presented mainly for the purpose of an application in an integrated circuit comprising an H-bridge driving an electric motor in a motor vehicle. However, other applications are also targeted by an aspect of the present invention, in particular in the context of driving any type of electrical load by way of an H-bridge.

Figure 1:
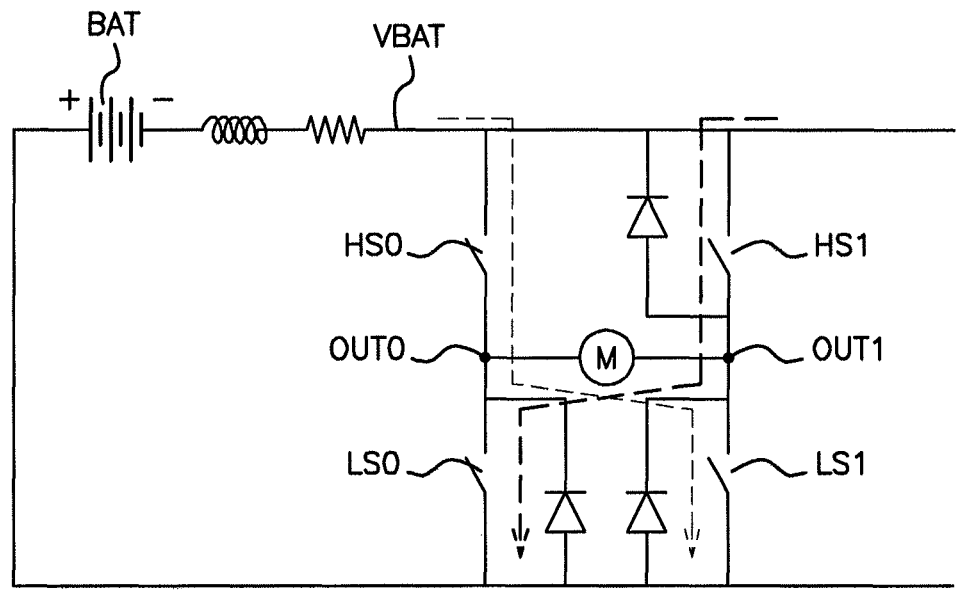
FIG. 1 shows an H-bridge device according to the prior art.

FIG. 1 represents the prior art and shows an H-bridge driving a load M. FIG. 1 has already been described above.

Figure 2:
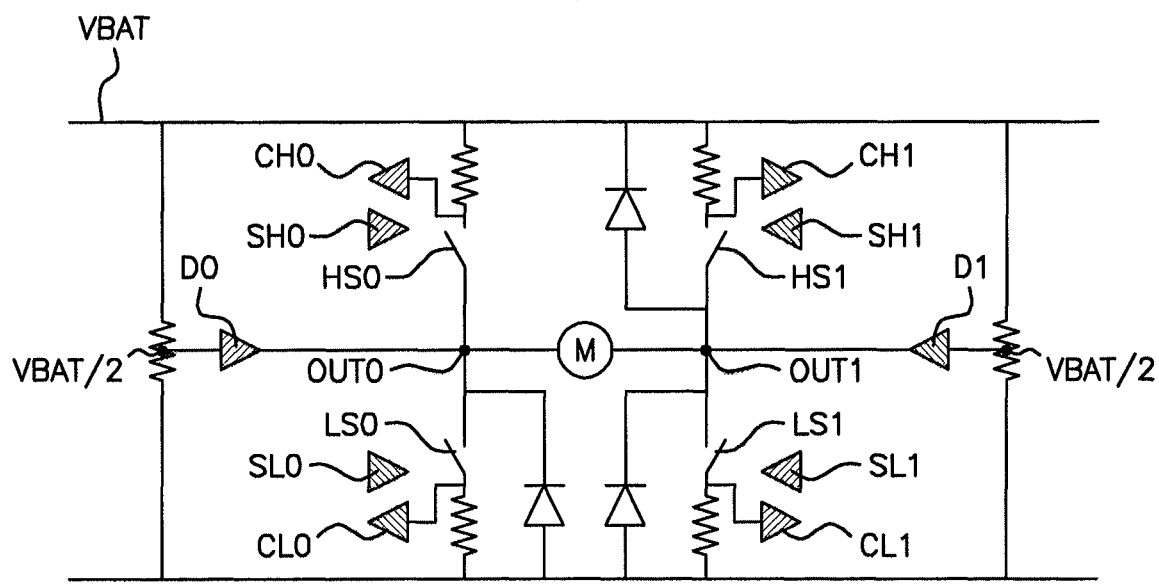
FIG. 2 shows an example of an H-bridge device according to an aspect of the invention, with means for controlling the slope and for controlling the magnitude of the current at each of the switches.

With reference to FIG. 2, the H-bridge device according to an aspect of the invention, in addition to the one described above to illustrate the prior art, comprises independent comparators CH0, CH1, CL0, CL1 monitoring the magnitude of the current flowing through each of said switches HS0, HS1, LS0, LS1 and also, according to the embodiment that is shown, independent means SH0, SH1, SL0, SL1 for controlling the current and voltage slopes at each switch HS0, HS1, LS0, LS1.

Controlled in 'lock anti-phase mode', said H-bridge operates, as described above, in the following way. The power supply delivers the voltage VBAT to the H-bridge. The first and fourth switches HS0 and LS1 (respectively the second and third switches HS1, LS0) are closed, so as to load the motor M in the forward direction (respectively in the reverse direction), said load 'seeing' a high power supply level. To unload the motor M, the first and fourth switches HS0, LS1 (respectively the second and third switches HS1, LS0) are opened (a possible battery loading phenomenon then occurring), and then the second and third switches HS1, LS0 (respectively the first and fourth switches HS0, LS1) are closed so as to allow unloading of the motor M. It is then necessary to ensure that a reversal of the polarity is not caused at the load, as this could have highly damaging consequences.

The independent comparators CH0, CH1, CL0, CL1 thus compare the magnitude of the current flowing through each of the switches HS0, HS1, LS0, LS1 with a reference current. If the magnitude of the current flowing through a switch falls below the reference current, typically of the order of 100 µA, then the switches are immediately opened.

According to an aspect of the invention, preferably, the detection of the imminent reversal of the polarity is thus performed both in the branch ON and in the branch OFF.

If the magnitude of the current in a branch becomes very low, typically less than 100 µA, then the switches HS0, HS1, LS0, LS1 are opened.

On the other hand, according to one preferred embodiment, independent means SH0, SH1, SL0, SL1 for controlling the current and voltage slopes at each of the switches HS0, HS1, LS0, LS1 are tasked with minimizing the electromagnetic interference created by the switching operations.

The principle consists in ensuring that the sum of the potentials at the connection points OUT0, OUT1, on either side of the load formed by the motor M, is equal to a constant, in this case equal to VBAT. To this end, the independent slope control means SH0, SH1, SL0, SL1 control the evolution of the magnitude of the current flowing through each of the switches, and also the evolution of the voltage across the terminals of said switches, as a function of time. These independent slope control means SH0, SH1, SL0, SL1 are configured and driven so as to ensure that the negative evolution of the current and of the voltage on the 'low side' side and the positive evolution of the current and of the voltage on the 'high side' side, on each side of the load, occur at the same rate. Thus, the sum of the potential at the connection point OUT0 and the potential at the connection point OUT1 is constant.

In this way, electromagnetic interference at the terminals of the load is reduced.

Moreover, according to the preferred embodiment shown in FIG. 2, a reference to the potential VBAT/2 is furthermore imposed at each connection point OUT0, OUT1, on either side of the motor M, so as to set the potential at said connection points in the case where the switches all change to the open state, and are therefore incapable of correctly controlling the potential of said connection points OUT0 and OUT1. This also makes it possible to further minimize the risks of electromagnetic interference.

To this end, with reference to FIG. 2, a 'push-pull' driver D0, respectively D1, associated with a resistive bridge, is connected to the connection point OUT0, respectively OUT1, on each side of the motor M, so as to impose a reference potential equal to half the high state, i.e. VBAT/2.

Thus, in practice, according to the preferred embodiment shown in FIG. 2, the switches HS0, HS1, LS0, LS1, the slope control means SH0, SH1, SL0, SL1 and the comparators CH0, CH1, CL0, CL1 are configured so that, when the first and fourth switches HS0, LS1 are closed, so as to load the motor M in the forward direction, the means SH0, SH1, SL0, SL1 for controlling the current and voltage slopes of said first and fourth switches HS0, LS1 ensuring that the sum of the potentials at the points of connection OUT0, OUT1 to the load, on either side of the load, is equal to a constant,
  i. when the pulse generator switches to a low state, the first and fourth switches HS0, LS1 are opened, the means SH0, SH1, SL0, SL1 for controlling the current and voltage slopes of said first and fourth switches HS0, LS1 ensuring that the sum of the potentials at the points of connection OUT0, OUT1 to the load, on either side of the load, is equal to a constant,
  ii. when the four switches HS0, HS1, LS0, LS1 are open, after a dead time, the second and third switches HS1, LS0 are closed, so as to unload the load, the independent comparators CH0, CH1, CL0, CL1 comparing the magnitude of the current flowing through each of the switches HS0, HS1, LS0, LS1 with the reference magnitude,
  iii. if the magnitude of the current flowing through each of the switches HS0, HS1, LS0, LS1 falls below the reference magnitude, the second and third switches HS1, LS0 are opened, the means SH0, SH1, SL0, SL1 for controlling the current and voltage slopes of said second and third switches HS1, LS0 ensuring that the sum of the potentials at the points of connection OUT0, OUT1 to the load, on either side of the load, is equal to a constant; to this end, preferably, the device according to an aspect of the invention includes 'push-pull' drivers imposing, during this phase, the potential VBAT/2 at the connection points OUT0, OUT1, on either side of the load, so as to set the potential of said connection points when the switches change to the open state,
  iv. when the pulse generator switches to a new high state, if the second and third switches HS1, LS0 were opened in the previous step, step i. is implemented again; otherwise, the second and third switches HS1, LS0 are opened, the means SH0, SH1, SL0, SL1 for controlling the current and voltage slopes of said second and third switches HS1, LS0 ensuring that the sum of the potentials at the points of connection OUT0, OUT1 to the load, on either side of the load, is equal to a constant, and then, after a dead time, step i. is implemented again.

Reciprocally, with continuing reference to FIG. 2, when the second and third switches HS1, LS0 are closed, so as to load the motor M in the reverse direction, the means SH1, SL0 for controlling the current and voltage slopes of said second and third switches HS1, LS0 ensuring that the sum of the potentials at the points of connection OUT0, OUT1 to the load, on either side of the load, is equal to a constant:
  i. when the pulse generator switches to a low state, the second and third switches HS1, LS0 are opened, the means SH1, SL0 for controlling the current and voltage slopes of said second and third switches HS1, LS0 ensuring that the sum of the potentials at the points of connection OUT0, OUT1 to the load, on either side of the load, is equal to a constant,
  ii. when the four switches HS0, HS1, LS0, LS1 are open, after a dead time, the first and fourth switches HS0, LS1 are closed, so as to unload the load, the independent comparators CH0, CH1, CL0, CL1 comparing the magnitude of the current flowing through each of the switches HS0, HS1, LS0, LS1 with the reference magnitude,
  iii. if the magnitude of the current flowing through each of the switches HS0, HS1, LS0, LS1 falls below the reference magnitude, the first and fourth switches HS0, LS1 are opened, the means SH0, SL1 for controlling the current and voltage slopes of said first and fourth switches HS0, LS1 ensuring that the sum of the potentials at the points of connection OUT0, OUT1 to the load, on either side of the load, is equal to a constant; preferably, the device according to an aspect of the invention includes 'push-pull' drivers imposing, during this phase, the potential VBAT/2 at the connection points OUT0, OUT1, on either side of the load,
  iv. when the pulse generator switches to a new high state VBAT, if the first and fourth switches HS0, LS1 were opened in the previous step, step i. is implemented again; otherwise, the first and fourth switches HS0, LS1 are opened, the means SH0, SL1 for controlling the current and voltage slopes of said first and fourth switches HS0, LS1 ensuring that the sum of the potentials at the points of connection OUT0, OUT1 to the load, on either side of the load, is equal to a constant, and then, after a dead time, step i. is implemented again.

In summary, an aspect of the present invention relates to an H-bridge device and an associated method for controlling an H-bridge, driving a load such as a DC current electric motor M, comprising independent comparators at each of the switches of the H-bridge, configured to prevent any reversal of polarity at the terminals of the load in an unloading phase of said load, without having to limit use of the pulse generator supplying said H-bridge.

According to one preferred embodiment, by way of independent means for controlling current and voltage slopes, at each of the switches of the H-bridge, and of means for setting the reference potential at the connection points to a value equal to half the supply voltage, the an aspect of present invention furthermore makes it possible to limit electromagnetic interference.

An aspect of the present invention is intended in particular for implementation in the motor vehicle sector, but may also be implemented in other fields in which an H-bridge is required to drive a load such as a DC current motor.

It is clarified furthermore that aspects of the present invention are not limited to the examples described above, and are open to many variants that are accessible to those skilled in the art.

The invention claimed is:

1. An H-bridge device with symmetrical load switching, said H-bridge comprising:
   a first, a second, a third and a fourth switches that are distributed over two branches of the H-bridge supplying power to a load, said four switches distributed over two branches being arranged, with respect to said load, such that the first and third switches are linked to the load via a first connection point, on one side of the load, and the second and fourth switches are linked to the load via a second connection point, on the other side of the load, such that the closure of one pair of switches, comprising the first and the fourth switches, allows a current to flow through the load in a forward direction, and that the closure of the other pair of switches, comprising the second and the third switches, allows a current to flow through the load in the reverse direction, an upper part of the H-bridge, called 'high side', comprising the first and second switches, being intended to be linked to a power supply, and a lower part of the H-bridge, called 'low side', comprising the third and fourth switches, being intended to be linked to ground, said H-bridge device being intended to be controlled by way of a pulse generator having a high state or a low state, and
   independent comparators for comparing a magnitude of the current flowing through each of the switches with a reference magnitude,
   wherein when the pulse generator is in a high state, the first and fourth switches are controlled to be closed, so that the current flows through the load in the forward direction, and
   wherein when the pulse generator switches to a low state:
     i. the first and fourth switches are opened,
     ii. after the four switches are open in step i. for a predetermined amount of time, the second and third switches are closed, so that the current flows through the load in the reverse direction, the independent comparators comparing the magnitude of the current flowing through each of the switches with the reference magnitude,
     iii. in response to the magnitude of the current flowing through one of the second and third switches during step ii. falling below the reference magnitude, the second and third switches are opened, and
     iv. when the pulse generator switches to a subsequent high state:
       if the second and third switches were opened in step iii., step i. is implemented again,
       if the second and third switches were not opened in step iii., the second and third switches are opened and then, after a predetermined amount of time, step i. is implemented again.

2. The H-bridge device with symmetrical load switching as claimed claim 1, wherein said switches and said comparators are configured so that, when the pulse generator is in a high state, the second and third switches being closed, so as to load the load in the reverse direction:
   i. when the pulse generator switches to a low state, the second and third switches are opened,
   ii. when the four switches are open, after a dead time, the first and fourth switches are closed, so as to unload the load, the independent comparators comparing the magnitude of the current flowing through each of the switches with the reference magnitude,
   iii. if the magnitude of the current flowing through one of the switches falls below the reference magnitude, the first and fourth switches are opened,
   iv. when the pulse generator switches to a new high state, if the first and fourth switches were opened in the previous step, step i. is implemented again; otherwise, the first and fourth switches are opened and then, after a dead time, step i. is implemented again.

3. The H-bridge device with symmetrical load switching as claimed in claim 2, further comprising independent means for controlling the current and voltage slopes, controlling the evolution, as a function of time, of the magnitude of the current flowing through each of said switches and the evolution, as a function of time, of the voltage across the terminals of each of said switches, said independent means for controlling the current and voltage slopes being configured and driven so as to ensure that the negative evolution of the current and of the voltage on the side of the lower part of the H-bridge and the positive evolution of the current and of the voltage on the side of the upper part of the H-bridge, on each side of the load, occur at the same rate, such that the sum of the potentials at the connection points, on either side of the load, is constant.

4. The H-bridge device with symmetrical load switching as claimed in claim 1, further comprising independent means for controlling the current and voltage slopes, controlling the evolution, as a function of time, of the magnitude of the current flowing through each of said switches and the evolution, as a function of time, of the voltage across the terminals of each of said switches, said independent means for controlling the current and voltage slopes being configured and driven so as to ensure that the negative evolution of the current and of the voltage on the side of the lower part of the H-bridge and the positive evolution of the current and of the voltage on the side of the upper part of the H-bridge, on each side of the load, occur at the same rate, such that the sum of the potentials at the connection points, on either side of the load, is constant.

5. A method for the symmetrical switching of an H-bridge device with symmetrical load switching as claimed in claim 4, comprising the following steps, when the pulse generator is in a high state, the first and fourth switches being closed, so as to load the load in the forward direction, and the means for controlling the current and voltage slopes of said first and fourth switches ensuring that the sum of the potentials at the points of connection to the load, on either side of the load, is equal to a constant:
   i. when the pulse generator switches to a low state, the first and fourth switches are opened, the means for controlling the current and voltage slopes of said first and fourth switches ensuring that the sum of the potentials at the points of connection to the load, on either side of the load, is equal to a constant,
   ii. when the four switches are open, after a dead time, the second and third switches are closed, so as to unload the load, the independent comparators comparing the magnitude of the current flowing through each of the switches with the reference magnitude,
   iii. if the magnitude of the current flowing through each of the switches falls below the reference magnitude, the second and third switches are opened, the means for controlling the current and voltage slopes of said second and third switches ensuring that the sum of the potentials at the points of connection to the load, on either side of the load, is equal to a constant,
   iv. when the pulse generator switches to a new high state, if the second and third switches were opened in the previous step, step i. is implemented again; otherwise, the second and third switches are opened, the means for controlling the current and voltage slopes of said second and third switches ensuring that the sum of the potentials at the points of connection to the load, on either side of the load, is equal to a constant, and then, after a dead time, step i. is implemented again.

6. The method for the symmetrical switching of an H-bridge device as claimed in claim 5, comprising the following steps, closing the second and third switches when the pulse generator is in a high so as to load the load in the reverse direction, and the means for controlling the current and voltage slopes of said second and third switches ensuring that the sum of the potentials at the points of connection to the load, on either side of the load, is equal to a constant:
   i. when the pulse generator switches to a low state, the second and third switches are opened, the means for controlling the current and voltage slopes of said second and third switches ensuring that the sum of the potentials at the points of connection to the load, on either side of the load, is equal to a constant,
   ii. when the four switches are open, after a dead time, the first and fourth switches are closed, so as to unload the load, the independent comparators comparing the magnitude of the current flowing through each of the switches with the reference magnitude,
   iii. if the magnitude of the current flowing through each of the switches falls below the reference magnitude, the first and fourth switches are opened, the means for controlling the current and voltage slopes of said first and fourth switches ensuring that the sum of the potentials at the points of connection to the load, on either side of the load, is equal to a constant,
   iv. when the pulse generator switches to a new high state, if the first and fourth switches were opened in the previous step, step i. is implemented again; otherwise, the first and fourth switches are opened, the means for controlling the current and voltage slopes of said first and fourth switches ensuring that the sum of the potentials at the points of connection to the load, on either side of the load, is equal to a constant, and then, after a dead time, step i. is implemented again.

7. The H-bridge device with symmetrical load switching as claimed in claim 1, further comprising means for setting a reference potential equal to half the high state at the first and second connection points, on either side of the load, when each of said switches is open.

8. The H-bridge device with symmetrical load switching as claimed in claim 7, wherein the means for setting the reference potential at the first and second connection points, on either side of the load, are formed by a resistive bridge and a 'push-pull' driver, on either side of the load, each of said 'push-pull' drivers being connected to one connection point, respectively.

9. A method for the symmetrical switching of an H-bridge device with symmetrical load switching as claimed in claim 8, comprising, closing the first and fourth switches when the pulse generator is in a high state so as to load the load in the forward direction, and the means for controlling the current and voltage slopes of said first and fourth switches ensuring that the sum of the potentials at the points of connection to the load, on either side of the load, is equal to a constant:
   i. when the pulse generator switches to a low state, the first and fourth switches are opened, the means for controlling the current and voltage slopes of said first and fourth switches ensuring that the sum of the potentials at the points of connection to the load, on either side of the load, is equal to a constant,
   ii. when the four switches are open, after a dead time, the second and third switches are closed, so as to unload the load, the independent comparators comparing the magnitude of the current flowing through each of the switches with the reference magnitude,
   iii. if the magnitude of the current flowing through each of the switches falls below the reference magnitude, the second and third switches are opened, the means for controlling the current and voltage slopes of said second and third switches ensuring that the sum of the potentials at the points of connection to the load, on either side of the load, is equal to a constant,
   iv. when the pulse generator switches to a new high state, if the second and third switches were opened in the previous step, step i. is implemented again; otherwise, the second and third switches are opened, the means for controlling the current and voltage slopes of said second and third switches ensuring that the sum of the potentials at the points of connection to the load, on either side of the load, is equal to a constant, and then, after a dead time, step i. is implemented again.

10. A method for the symmetrical switching of an H-bridge device with symmetrical load switching as claimed in claim 7, comprising, closing the first and fourth switches when the pulse generator is in a high state so as to load the load in the forward direction, and the means for controlling the current and voltage slopes of said first and fourth switches ensuring that the sum of the potentials at the points of connection to the load, on either side of the load, is equal to a constant:
   i. when the pulse generator switches to a low state, the first and fourth switches are opened, the means for controlling the current and voltage slopes of said first and fourth switches ensuring that the sum of the potentials at the points of connection to the load, on either side of the load, is equal to a constant,
   ii. when the four switches are open, after a dead time, the second and third switches are closed, so as to unload the load, the independent comparators comparing the magnitude of the current flowing through each of the switches with the reference magnitude,
   iii. if the magnitude of the current flowing through each of the switches falls below the reference magnitude, the second and third switches are opened, the means for controlling the current and voltage slopes of said second and third switches ensuring that the sum of the potentials at the points of connection to the load, on either side of the load, is equal to a constant,
   iv. when the pulse generator switches to a new high state, if the second and third switches were opened in the previous step, step i. is implemented again; otherwise, the second and third switches are opened, the means for controlling the current and voltage slopes of said second and third switches ensuring that the sum of the potentials at the points of connection to the load, on either side of the load, is equal to a constant, and then, after a dead time, step i. is implemented again.

11. The H-bridge device with symmetrical load switching as claimed in claim 1, wherein the reference magnitude is equal to 100 μA.

12. A method for the symmetrical switching of an H-bridge device with symmetrical load switching as claimed in claim 11, comprising, closing the first and fourth switches when the pulse generator is in a high state so as to load the load in the forward direction, and the means for controlling the current and voltage slopes of said first and fourth switches ensuring that the sum of the potentials at the points of connection to the load, on either side of the load, is equal to a constant:
  i. when the pulse generator switches to a low state, the first and fourth switches are opened, the means for controlling the current and voltage slopes of said first and fourth switches ensuring that the sum of the potentials at the points of connection to the load, on either side of the load, is equal to a constant,
  ii. when the four switches are open, after a dead time, the second and third switches are closed, so as to unload the load, the independent comparators comparing the magnitude of the current flowing through each of the switches with the reference magnitude,
  iii. if the magnitude of the current flowing through each of the switches falls below the reference magnitude, the second and third switches are opened, the means for controlling the current and voltage slopes of said second and third switches ensuring that the sum of the potentials at the points of connection to the load, on either side of the load, is equal to a constant,
  iv. when the pulse generator switches to a new high state, if the second and third switches were opened in the previous step, step i. is implemented again; otherwise, the second and third switches are opened, the means for controlling the current and voltage slopes of said second and third switches ensuring that the sum of the potentials at the points of connection to the load, on either side of the load, is equal to a constant, and then, after a dead time, step i. is implemented again.

* * * * *